Figure 1:
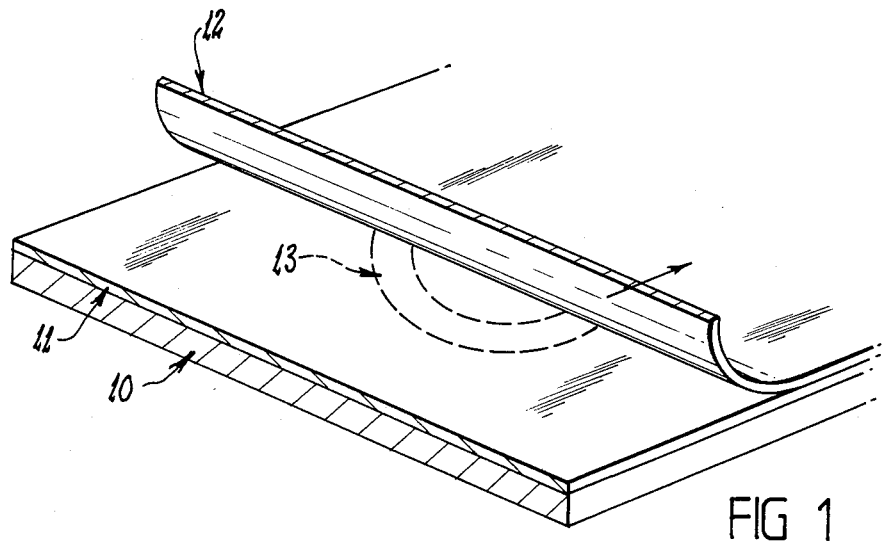

United States Patent [19]

Woodward

[11] Patent Number: 4,619,876

[45] Date of Patent: Oct. 28, 1986

[54] FLEXIBLE DISPLAY IMAGE

[75] Inventor: Lawrence Woodward, Middle Park, Australia

[73] Assignee: Variaset Pty. Limited, Mitcham, Australia

[21] Appl. No.: 719,495

[22] Filed: Apr. 4, 1985

[30] Foreign Application Priority Data

Apr. 9, 1984 [AU] Australia ............................... PG4480
Aug. 16, 1984 [AU] Australia ............................. PG6613

[51] Int. Cl.$^4$ ................................................ G03C 1/00
[52] U.S. Cl. ......................................... 430/11; 430/13; 430/45; 355/77
[58] Field of Search .................... 430/66, 4, 11, 13, 45; 355/3 TR, 77

[56] References Cited

U.S. PATENT DOCUMENTS 3,140,174  7/1964  Clark ....................................... 430/66
3,256,089  6/1966  Clark et al. ............................ 430/66
4,092,173  5/1978  Novak et al. ......................... 430/66

Primary Examiner—John L. Goodrow
Attorney, Agent, or Firm—Ladas & Parry

[57] ABSTRACT

A display image for display and sign applications. The display image comprises: a flexible substrate, an image layer on the flexible substrate, the image layer comprising a flexible tacky photopolymer having been exposed to electromagnetic radiation and having a toner applied to create an image from exposed areas, such as by the Cromalin process, and a transparent or translucent flexible sealing layer such as Flexmark film overlying the image layer so as to sandwich the image layer between the flexible substrate and the sealing layer producing a flexible display image which can be flexed or bent through an angle without craking or crazing being readily discernable and showing as an adverse effect on or deterioration of the visual quality of the image.

12 Claims, 4 Drawing Figures

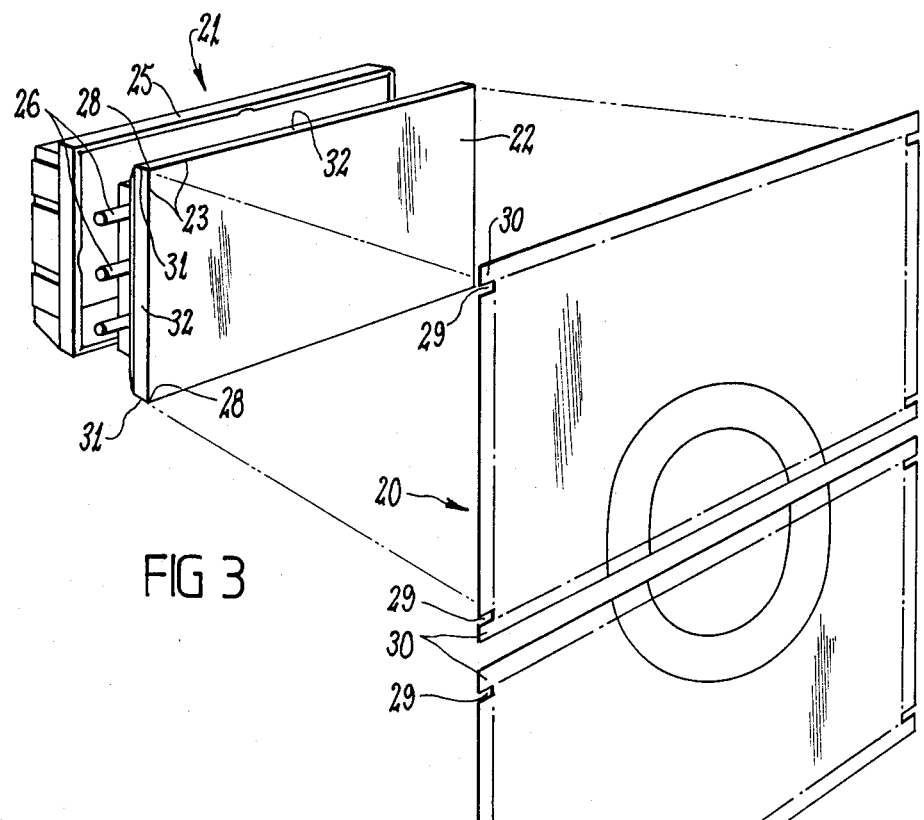
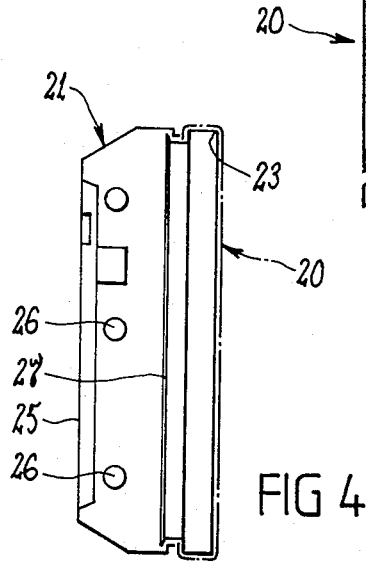

FLEXIBLE DISPLAY IMAGE

This invention relates to display images for display and sign applications, particularly for the graphic arts and advertising industries and also to methods of producing such display images.

One presently commercially available and commonly used system of producing display images for graphic arts and advertising industries is known as the Cromalin (registered trade mark) colour display system produced by the Du Pont Company. The Cromalin colour display system produced full colour displays on a number of possible flat surfaces. The system comprises Cromalin industrial display film dry toner, and laminating and toning equipment. A colour display is produced by laminating Cromalin film onto a flat display support or substrate such as acrylic sheeting, glass, vinyl, painted hardboard, metal, etc. and then exposing it in contact with a film positive using an ultra-violet rich light source.

The Cromalin display film is a tacky photopolymer sandwiched between Mylar (registered trade mark) polyester film and polypropylene film. It is slow in speed and can be handled for short times under normal room light without damage. In use, the film is mounted on a laminator which removed the polypropylene film and, using heat and pressure, laminates the photopolymer and Mylar to the selected substrate. The laminated substrate is exposed to a photographic film positive. The photopolymer is hardened only where it is exposed to ultraviolet radiation. The film positive used should be made using high quality high contrast film which give high density image elements, such as litho-film. Following exposure, the Mylar sheet is removed and the photopolymer layer is dusted with toner which adheres to the non-exposed areas.

The toner is a dry powder which adheres to the unexposed surface areas. The toners used in the Cromalin system that is commercially available are translucent so that the image can be used either as a back-lit image with a suitable substrate or as a front-lit reflective image.

The steps of laminating, exposing, and toning are repeated for each colour, creating a multi-colour final display image. For example, a four colour process can be used utilising, say, magenta, cyan, yellow and black to create any desired colour. Additional protection in the form of a hardened photopolymer layer and/or an overspray completes the display image.

One problem with the final display image resulting from the Cromalin process is that the resulting image is semi-rigid and the image will crack, split, craze or splinter and break away from the substrate if the substrate is bent through an angle of about 30° or more. This makes the image resulting from the Cromalin system unsuitable for some applications where the image is desirably flexible. For example, if the image needs to be manipulated and bent during installation, application or erection of the image, e.g. if it is to be applied to a surface of a different shape to the substrate, the Cromalin display image produced as outlined above is unsuitable.

It is an object of the present invention to provide a high quality image and a process of producing an image that is flexible so that it can be manipulated and bent without adversely affecting the visual quality of the image.

According to the present invention there is provided a display image for display and sign applications, the display image comprising:
a flexible substrate,
an image layer on the flexible substrate, the image layer comprising a photosensitive material having been exposed to electromagnetic radiation and having a toner applied to create an image from exposed areas of the photosensitive material,
a transparent or translucent flexible sealing layer overlying the image layer so as to sandwich the image layer between the flexible substrate and the sealing layer producing the display image which can be flexed or bent through an angle without cracking or crazing being readily discernable and showing as an adverse effect on or deterioration of the visual quality of the image.

The photosensitve material preferably comprises a flexible tacky photopolymer. The production of the image layer of the substrate may be by the Cromalin process as outlined above, or by any similar process utilising a photopolymer exposed to radiation and having toner applied thereto.

The present invention also provides a process for producing a display image for display and sign application, the process comprising the steps of:
providing a flexible substrate,
laminating to the substrate a flexible tacky photopolymer on a backing film so that the photopolymer contacts the substrate,
exposing the laminate comprising the flexible substrate and the photopolymer and the backing film to a film positive so as to harden the exposed portions of the photopolymer,
removing the backing film so as to uncover any unexposed flexible tacky photopolymer sections on the substrate,
applying toner to the unexposed photopolymer sections so as to adhere thereto producing an image layer,
applying a transparent or translucent flexible sealing layer so as to overlie the image layer while the toner coated photopolymer sections remain flexible so as to thereby sandwich the image layer between the flexible substrate and the sealing layer such that the display image produced can be flexed or bent through an angle without cracking or crazing being readily discernable and showing as an adverse effect on or deterioration of the visual quality of the image.

The application of the sealing layer is preferably carried out with pressure being applied to the sealing layer so as to bring the sealing layer into intimate contact with the image layer. For example, the application of pressure may be achieved by passing the substrate with the image layer thereon between a pair of rollers, the sealing layer also being fed between the rollers so that the laminated product emerging from the rollers has the sealing layer firmly pressed to and in intimate contact with the image layer.

Preferably the step of applying the sealing layer is carried out so as to promote the exclusion of air and particularly oxygen from the resulting laminate of the sealing layer with the substrate and image layer.

The step of applying the sealing layer may be carried out within forty-eight hours after the steps resulting in the production of the image layer. It is preferable that the sealing layer is applied within four hours of production of the image layer and most advantageously is applied substantially immediately after the production of the image layer, e.g. within the order of minutes.

Adhesive may be provided between the sealing layer and the image layer so as to promote intimate contact of the sealing and image layers and to create a stable and durable display image. The adhesive may be coated on the sealing layer before or during the step of applying the sealing layer to the image layer.

The display image of the present invention is particularly suitable for application to a display module for the purpose of displaying an image. For example, a suitable module may have a display face, the major part of the area of the display face being substantially flat, the peripheral edges of the display face being radiused to enable a plurality of like display modules to be mounted in abutting relationship with little or no join line between adjacent modules being discernable, the display image in this case being applied to the display face and extending around the radiused pheripheral edges.

Figure 2:
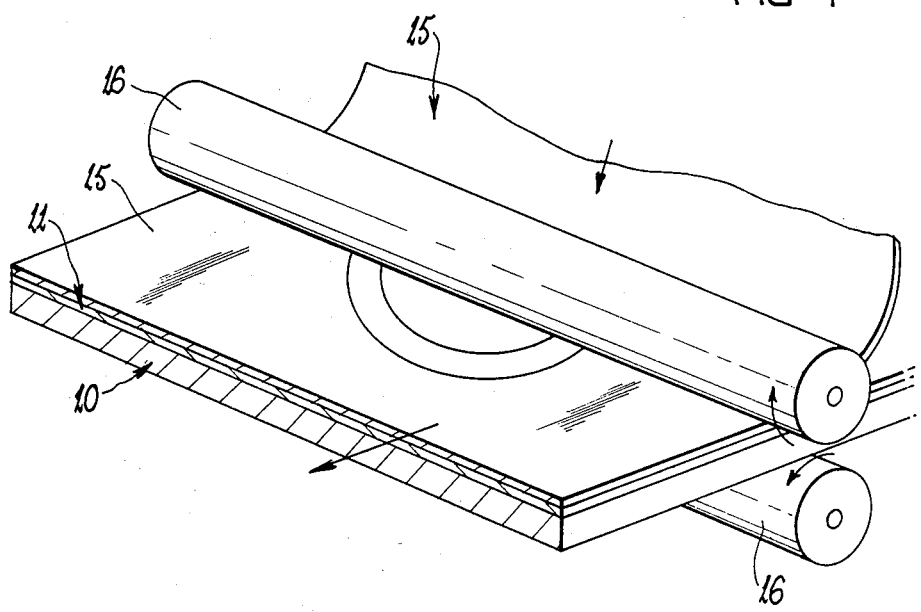

The product and process according to preferred embodiments of the present invention will now be described with particular reference to the accompanying drawings, but it is to be appreciated that the accompanying drawings are for illustrative purposes and not to limit the generality of the preceding description. In the drawings:

FIG. 1 is showing the removal of a backing film from the substrate and image layer, FIG. 2 illustrates the application of the sealing layer in one possible embodiment, FIG. 3 shows a perspective exploded view of a display module for which the display image of the present invention is suitable, and FIG. 4 shows a side sectional view of the display module of FIG. 3.

The display image of the present invention, and the method for producing the display image utilises a flexible substrate (10). The substrate (10) may be made of any suitable material and is preferably substantially flat, at least initially, so as to facilitate the production of the image layer (11) thereon by the Cromalin or similar process. Suitable substrates (10) have been found to be acrylic, vinyl and similar flexible plastics materials. For most final purposes of the display image, the flexible substrate (10) is preferably made of a clear or at least translucent material so that the display image can be either back-lit or front-lit as a reflective display as desired. One suitable substrate material (10) found to be useful for receiving the image layer (11) of the present invention is Fujishiko Vinyl (available in Australia from L. Vogel and Son Pty. Ltd.).

The creation of the image layer (11) in the process of the present invention is preferably carried out by the Cromalin process. This process has been outlined above in relation to the prior art and reference may be made to that section of the specification for a general description of the process. Also reference may be made to FIG. 1 of the drawings where removal of the backing film is shown. That is, the flexible tacky photopolymer which becomes the image layer (11) is backed by backing film (12) (the Mylar film). That film (12) and the photopolymer is laminated to the substrate (10). The photopolymer is then exposed to a film positive so as to harden exposed portions of the photopolymer. The backing film (12) is then removed uncovering unexposed flexible tacky photopolymer sections (13) on the substrate (10). Toner is then applied to the unexposed photopolymer sections (13) so as to adhere thereto. Normally as previously described, the image layer (11) created by the Cromalin process is relatively brittle and it splinters, cracks or crazes and breaks away from the substrate (10) if bent beyond about 30° over a relatively small radius.

In accordance with the present invention, the image layer (11) is overlayed with a transparent or translucent flexible sealing layer (15), preferably while the toner coated photopolymer sections (13) remain flexible. It has been found that this process can render the image layer (11) produced by the Cromalin process flexible to the extent that the final laminate constituting the flexible display image can be bent and flexed when being transported, used, applied or installed as a display or sign.

Referring to FIG. 2, the application of the sealing layer (15) to the substrate (10) and image layer (11) is accompanied by the application of pressure so as to bring the sealing layer (15) into intimate contact with the image layer (11). In FIG. 2 the application of pressure is achieved by passing the substrate (10) with the image layer (11) thereon between a pair of rollers (16), the sealing layer (15) also being fed between the rollers (16) so that the laminated product emerging from the rollers (16) has the sealing layer (15) firmly pressed to and in intimate contact with the image layer (11). The sealing layer (15) for example may be fed from a roll of sealing layer material (not shown). The pressure applied during the application of the sealing layer (15) is effectively a function of the both the roller speed and the force being applied by the opposed roller (16), but the pressure found to be suitable can be qualitatively described as "moderate" pressure. It is preferable that little or no heat be applied during the application of the sealing layer (15) to the image layer (11). In fact, it has been found that for the particular sealing layer material found to be suitable and described below (Flexmark), the upper roller in FIG. 2 in contact with the sealing layer (15) should be cold, i.e. not substantially above room temperature.

The precise period after creation of the image layer (11) on the substrate (10) by the Cromalin process within which the sealing layer (15) should be applied has not been determined empirically. However, it has been found that application of the sealing layer is preferably carried out within forty-eight hours after the steps resulting in the production of the image layer (11). Most preferably the application of the sealing layer (15) is carried out within four hours of production of the image layer (11). Most conveniently the application of the sealing layer (15) can be carried out substantially immediately after the final step in the production of the image layer (11), i.e. within a period of the order of minutes after completion of the image layer creation.

The full possible range of materials for the sealing layer (15) has not been empirically determined. However, preferably the sealing layer (15) is adhesive or the sealing layer material has applied thereto an adhesive material so as to promote intimate contact of the sealing layer (15) with the image layer (11) and creation of a sufficient adhesion for the purpose of creating a stable and durable final display image. One suitable material found to be useful for the sealing layer is a clear plastics adhesive film produced by Du Pont and marketed under the trade mark Flexmark. This material is believed to consist of a Mylar film and an adhesive material layer. The Flexmark material is promoted as a material which can increase the ultraviolet stability of a material to which it is applied. The Flexmark layer is believed to be opaque to or at least substantially attenuates ultraviolet radiation and this is useful to prevent fading of some pigments and dys used in the advertising and graphic arts industries.

The mechanism by which the application of the Flexmark film as sealing layer (15) renders the Cromalin image layer (11) flexible is postulated to depend upon the exclusion of oxygen from the image layer (11). In study and development of the invention it has been determined with reasonable certainty that the exclusion of oxygen from the image (11) is the main factor in rendering and maintaining the image flexible. Therefore it is believed preferable that the application of the sealing layer (15) is carried out so as to promote the exclusion of air or oxygen from the resulting laminate of the sealing layer (15) with the substrate (10) and image layer (11). The application of pressure by rollers (16) is therefore desirable during the application of the sealing layer (15). The application of a sealing layer (15) in the form of a flexible film having an adhesive layer is believed to be particularly appropriate for excluding oxygen, but it will be appreciated that another possibility is to apply the sealing layer (15) using vacuum technology followed by sealing around the edges of the display image so as to exclude air and particularly oxygen re-entering the space between the sealing layer (15) and the image layer (11).

Although the exclusion of oxygen is believed to be important in the mechanism resulting in the Cromalin process produced image being flexible, this is still a postulate. For example, it may alternatively be possible that the application of the sealing layer (15) by applying pressure softens the photopolymer material and the opacity of the Flexmark material to ultraviolet light may prevent rehardening. Another possible mechanism is that some material in the adhesive layer of the Flexmark film acts as a plasticiser which migrates into the photopolymer of the image layer (11) during the application of the Flexmark film. Another possibility seems to be that the Cromalin image layer actually develops very fine cracks when the sealing layer (15) is being applied, or at least when the final display image is bent or flexed, but that the fine particles created are firmly held in place by the adhesive layer of the Flexmark film with the result that no adverse effect on the visual quality of the image results.

It will be seen that the product resulting from the process according to the present invention provides substantial improvements over the prior display image outlined herein. In particular, the display image created can be flexed and bent as desired without deterioration of the image quality, with the result that the display image is a much more versatile product.

One display system known as the Variaset display system comprises display tiles (FIGS. 2 and 3) to which transparent display material (20) is applied. Each Variaset display tile or module (21) has a display face (22), the major part of the area of the display face (22) being substantially flat. The peripheral edges (23) of the display face (22) are radiused to enable a plurality of like display modules (21) to be mounted in abutting relationship and to be back or front-lit with little or no join lines between adjacent modules (21) being discernable. The display image of the present invention can be applied to the display face (22) and extend around the radiused peripheral edges (23) without image deterioration due to cracking, crazing or breaking away of the image where the display image is bent or curved around the edges (23). Other features of the Variaset tile comprise a reflector housing (25) electric lighting elements (26) and dust seal (27).

The product and process to which the present application relates were developed specifically for application of an image to Variaset display tiles (21). In particular, it was realised that a large scale image could be created by arranging a plurality of Variaset tiles, each bearing an individual image, in a two dimensional array so that the images fitted together to make a composite large scale image. However, the quality of the small images needed to be relatively high produce a large final image of acceptable quality.

The Cromalin process of high quality image creation was known for some time but was considered inappropriate for Variaset tiles. This perceived unsuitability of the Cromalin process was a result of the fact that the Variaset tiles have the radiused edges (23) around which any image (20) applied to the tile (21) must pass, such radiused edges (23) extending around through 90°, and also the Variaset tiles (21) have relatively sharp corners (28) where the radiused edges (23) meet and any image (20) applied to the Variaset tiles must extend right to the tile corners (28). The image produced by the known Cromalin process was brittle and was totally unsuitable for application to the Variaset tiles.

The experimentation with the Cromalin image and the process of producing that image leading to the present application was carried out in an attempt to make that image suitable for Variaset tiles. In particular, the experimentation leading to the invention of the flexible image and process subject of this application was carried out specifically for the Variaset tiles and utilising such tiles for testing of the experimental images.

It was found that the image created in accordance with the preferred embodiments of the invention is foldable around the radiused edges (23) of Variaset tiles, through the 90° required, without cracking or image quality deterioration. As shown in FIG. 3 the image (20) to be applied to the face (22) of the tile (21) may be slotted at (29) so that the resulting tab (30) can be folded around the short rewardly extending edge (31).

Alternatively, if desired at the corners of the tile (21), the flexible image (20) of the invention can be folded over or folded back upon itself without cracking or other image deterioration. In particular it has been found that the flexible image can be folded over one edge (23) near a corner (28), then folded over the adjacent edge (23) at the same corner (28) such that a double layer of the image (20) is produced which is then folded back upon itself. No cracking or image deterioration has occurred during this folding. The double layer can be folded back upon itself along line (31) leading back from the tile corner (28) and the quadruple layer pulled down against one side wall (32) of the Variaset tile (21) again without cracking of the image at the corner (28) of the tile. Thus an image can be provided on the face (22) of the Variaset tile (21) which extends right to and around the edges (23) and also right to and around the corners (28) without image deterioration, enabling the construction of modular images of high quality.

Although creation of a flexible image suitable for the Variaset tiles (21) was the ultimate aim of the development of the invention, it was realised that the process of creating the flexible image and of course the flexible image itself might well be useful in applications other than using the Variaset tiles (21). In particular, any application in the graphic arts or such similar field requiring a flexible image of high quality could be satisfied by the product and process of the invention.

Finally it is to be understood that various alterations, modifications and/or additions may be made to the steps of the process and the construction and arrangement of components of the present invention as herein particularly described without departing from the scope of the present invention as defined in the appended claims.

The claims defining the invention are as follows:

1. A display image for display and sign applications involving bending or flexing through a substantial angle or relatively small radius curve, the display image comprising:
   a flexible substrate,
   an image layer on the flexible substrate, the image layer comprising an initially flexible tacky photopolymer which has been backed by a backing film, the photopolymer being of a kind that normally becomes brittle after removal of the backing film, the photopolymer having been exposed through a film positive to electromagnetic radiation so as to harden exposed portions of the photopolymer, the backing film then having been removed thereby uncovering unexposed flexible tacky photopolymer sections on the substrate, toner having been applied to the unexposed photopolymer sections so as to adhere thereto so as to thereby create an image, and
   a transparent or translucent flexible sealing layer applied to the image layer while the toner coated photopolymer section remains flexible so as to sandwich the image layer between the flexible substrate and the sealing layer producing the display image which can be flexed or bent through an angle without cracking or crazing being readily discernable and showing as an adverse effect on or deterioration of the visual quality of the image.

2. A display image as claimed in claim 1 and further including an adhesive layer between the sealing layer and the image layer so as to promote intimate contact of the sealing layer with the image layer and to create a stable and durable display image.

3. A display module for displaying an image, the module having applied thereto a display image comprising:
   a flexible susbstrate,
   an image layer on the flexible substrate, the image layer comprising an initially flexible tacky photopolymer which has been backed by a backing film, the photopolymer being of a kind that normally becomes brittle after removal of the backing film, the polymer having been exposed through a film positive to electromagnetic radiation so as to harden exposed portions of the photopolymer, the backing film then having been removed thereby uncovering unexposed flexible tacky photopolymer sections on the substrate, toner having been applied to the unexposed photopolymer sections so as to adhere thereto so as to thereby create an image, and
   a transparent or translucent flexible sealing layer applied to the image layer while the toner coated photopolymer section remains flexible so as to sandwich the image layer between the flexible substrate and the sealing layer producing the display image which can be flexed or bent through an angle without cracking or crazing being readily discernable and showing as an adverse effect on or deterioration of the visual quality of the image, the module having a display face, a major part of the display face area being substantially flat, peripheral edges of the display face being radiused to enable a plurality of like display modules to be mounted in abutting relationship with little or no joint line between adjacent modules being discernable, the display image being applied to the display face and extending around radiused peripheral edges.

4. A process for producing a display image for display and sign applications involving bending or flexing through a substantial angle or relatively small radius curve, the process comprising the steps of:
   providing a flexible substrate;
   laminating to the substrate a flexible tacky photopolymer on a backing film so that the photopolymer contacts the substrate, the photopolymer being of a kind that normally becomes brittle after removal of the backing film, thereby forming a laminate;
   exposing the laminate comprising the flexible substrate, the photopolymer and the backing film to a film positive so as to harden exposed portions of the photopolymer while leaving any unexposed photopolymer section in a flexible tacky state;
   removing the backing film so as to uncover said unexposed flexible tacky photopolymer sections on the substrate;
   applying toner to the unexposed photopolymer sections so as to adhere thereto producing an image layer;
   applying a transparent or translucent flexible sealing layer so as to overlie the image layer while toner coated photopolymer sections remain flexible and before substantial embrittling thereof so as to thereby sandwich the image layer between the flexible substrate and the sealing layer such that the display image produced can be flexed or bent through an angle without cracking or crazing being readily discernable and showing as an adverse effect on or deterioration of the visual quality of the image.

5. A process as claimed in claim 4 wherein the step of applying the sealing layer is carried out with the application of pressure to the sealing layer so as to bring the sealing layer into intimate contact with the image layer.

6. A process as claimed in claim 5 wherein the application of pressure is achieved by passing the substrate with the image layer thereon between a pair of rollers, the sealing layer also been fed between the rollers so that the laminated product emerging from the rollers has the sealing layer firmly pressed to and in intimate contact with the image layer.

7. A process as claimed in claim 4 wherein the step of applying the sealing layer is carried out so as to promote the exclusion of air or oxygen from the resulting laminate of the sealing layer with the substrate and image layer.

8. A process as claimed in claim 4 wherein the step of applying the sealing layer is carried out within forty-eight hours after the preceding steps producing the image layer.

9. A process as claimed in claim 8 wherein the step of applying the sealing layer is carried out within four hours of production of the image layer.

10. A process as claimed in claim 9 wherein the step of applying the sealing layer is carried out substantially immediately after the production of the image layer.

11. A process as claimed of claim 4 wherein adhesive is between the sealing layer and the image layer so as to promote intimate contact of the sealing layer with the image layer and to create a stable and durable display image.

12. A process according to claim 4, wherein the transparent or translucent flexible sealing layer is applied substantially immediately after the step of applying toner, said sealing layer being substantially impervious to oxygen, the application of the sealing layer of the image layer being accompanied by application of pressure so as to substantially exclude oxygen from a boundary region between the sealing layer and the image layer.

* * * * *